United States Patent
Qing et al.

(10) Patent No.: US 12,336,395 B2
(45) Date of Patent: Jun. 17, 2025

(54) DISPLAY SUBSTRATE, DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Haigang Qing, Beijing (CN); Yunsheng Xiao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 689 days.

(21) Appl. No.: 17/055,110

(22) PCT Filed: Sep. 30, 2019

(86) PCT No.: PCT/CN2019/109326
§ 371 (c)(1),
(2) Date: Nov. 12, 2020

(87) PCT Pub. No.: WO2021/062588
PCT Pub. Date: Apr. 8, 2021

(65) Prior Publication Data
US 2021/0367023 A1   Nov. 25, 2021

(51) Int. Cl.
*H10K 59/131* (2023.01)
*H10K 50/814* (2023.01)
(Continued)

(52) U.S. Cl.
CPC ......... *H10K 59/131* (2023.02); *H10K 50/814* (2023.02); *H10K 59/122* (2023.02); *H10K 59/124* (2023.02); *H10K 59/873* (2023.02)

(58) Field of Classification Search
CPC .. H10K 50/814; H10K 50/844; H10K 59/122; H10K 59/124; H10K 59/131; H10K 50/822
See application file for complete search history.

(56) References Cited

U.S. PATENT DOCUMENTS

| 2003/0043331 A1* | 3/2003 | Oowaki | G02F 1/13452 |
| | | | 349/151 |
| 2012/0139000 A1* | 6/2012 | Lee | H10D 86/481 |
| | | | 438/23 |

(Continued)

FOREIGN PATENT DOCUMENTS

| CN | 102569675 A | 7/2012 |
| CN | 103907218 A | 7/2014 |

(Continued)

OTHER PUBLICATIONS

European Patent Office, Partial Supplementary European Search Report Issued in Application No. 19945447.1, Sep. 22, 2022, Germany, 12 pages.

(Continued)

*Primary Examiner* — Shaun M Campbell
(74) *Attorney, Agent, or Firm* — McCoy Russell LLP

(57) ABSTRACT

A display substrate includes a source-drain metal layer and a common electrode layer. A pattern of the source-drain metal layer includes a power supply voltage line; the power supply voltage line includes a wire inlet portion; the display substrate further includes a barrier wall, there is a gap between an orthographic projection of the barrier wall on the base substrate and an orthographic projection of the effective display area on the base substrate. The wire inlet portion includes a first part and a second part; an orthographic projection of the first part on the base substrate and an orthographic projection of the gap on the base substrate at least partially overlap; the second part is located at a side of (Continued)

the barrier wall away from the effective display area and located between the barrier wall and the binding area, and used for receiving power supply voltage signal.

13 Claims, 13 Drawing Sheets

(51) Int. Cl.
*H10K 59/122* (2023.01)
*H10K 59/124* (2023.01)
*H10K 59/80* (2023.01)

(56) References Cited

U.S. PATENT DOCUMENTS

| | | | |
|---|---|---|---|
| 2012/0162053 A1* | 6/2012 | Lee | H10K 59/1315 345/80 |
| 2013/0328024 A1 | 12/2013 | Mizusaki et al. | |
| 2014/0291661 A1 | 10/2014 | Ono et al. | |
| 2017/0278469 A1* | 9/2017 | Iwami | G09G 3/3611 |
| 2018/0151838 A1 | 5/2018 | Park et al. | |
| 2019/0050096 A1* | 2/2019 | Wang | H10K 59/35 |
| 2019/0206973 A1* | 7/2019 | Kim | H10K 59/121 |
| 2020/0013843 A1* | 1/2020 | Choi | H10K 59/1213 |
| 2020/0411615 A1* | 12/2020 | Ding | H10K 71/00 |
| 2021/0005701 A1* | 1/2021 | Matsui | H10K 77/111 |
| 2021/0020715 A1* | 1/2021 | Ochi | G09F 9/00 |
| 2021/0223438 A1* | 7/2021 | Baek | G02B 1/14 |
| 2021/0223598 A1* | 7/2021 | Katsuta | H01L 29/78633 |
| 2021/0280655 A1* | 9/2021 | Kanaya | H10K 59/124 |

FOREIGN PATENT DOCUMENTS

| | | | | |
|---|---|---|---|---|
| CN | 109713017 A | | 5/2019 | |
| CN | 110265579 A | | 9/2019 | |
| WO | WO-2021057757 A1 | * | 4/2021 | ......... H01L 27/3244 |

OTHER PUBLICATIONS

ISA China National Intellectual Property Administration, International Search Report and Written Opinion Issued in Application No. PCT/CN2019/109326, Jun. 29, 2020, WIPO, 14 pages. (Submitted with Partial Translation).

European Patent Office, Extended European Search Report Issued in Application No. 19945447.1, Jan. 18, 2023, Germany, 14 pages.

European Patent Office, Office Action Issued in Application No. 19945447.1, Jun. 27, 2024, Germany, 10 pages.

* cited by examiner

DISPLAY SUBSTRATE, DISPLAY PANEL AND DISPLAY DEVICE

CROSS-REFERENCE TO RELATED APPLICATION

The present application is a U.S. national phase of International Application No. PCT/CN2019/109326, entitled "DISPLAY SUBSTRATE, DISPLAY PANEL AND DISPLAY DEVICE," filed on Sep. 30, 2019. The entire contents of the above-referenced application are hereby incorporated by reference for all purposes.

TECHNICAL FIELD

The present disclosure relates to the field of display technology, in particular to a display substrate, a display panel and a display device.

BACKGROUND

With the development of Active-matrix organic light-emitting diode (AMOLED) technology, AMOLED are more commonly used in mobile terminals. The small-molecule light-emitting materials that constitute the core of the AMOLED panel are very afraid of water and oxygen intrusion. Once the light-emitting components are corroded by water and oxygen, the light-emitting components will be fault, resulting in dark spots on the display.

SUMMARY

In one aspect, the present disclosure provides in some embodiments a display substrate including a base substrate, and a source-drain metal layer and a common electrode layer sequentially disposed on the base substrate, wherein a pattern of the source-drain metal layer includes a power supply voltage line; the power supply voltage line includes a wire inlet portion; the display substrate includes an effective display area and a binding area; the display substrate further includes a barrier wall arranged on the base substrate and surrounding the effective display area, there is a gap between an orthographic projection of the barrier wall on the base substrate and an orthographic projection of the effective display area on the base substrate; the wire inlet portion includes a first part and a second part; an orthographic projection of the first part on the base substrate and an orthographic projection of the gap on the base substrate at least partially overlap; the second part is located at a side of the barrier wall away from the effective display area and located between the barrier wall and the binding area, and the second part is used for receiving power supply voltage signal; the common electrode layer is in direct contact with the power supply voltage line in an overlapping area between the first part and the common electrode layer.

In some embodiment of the present disclosure, the display substrate further comprises a conductive connection layer disposed between the power supply voltage line and the common electrode layer; the power supply voltage line further includes a main body, and the main body and the common electrode layer are of lap-joint through the conductive connection layer.

In some embodiment of the present disclosure, the display substrate further includes an anode provided in the effective display area; the conductive connection layer and the anode are arranged at the same layer.

In some embodiment of the present disclosure, the display substrate further includes a first insulating layer disposed between the power supply voltage line and the conductive connection layer, and a first organic layer disposed between the conductive connection layer and the common electrode layer, wherein the common electrode layer and the first part are of lap-joint across a first opening that penetrates the first insulating layer and a second opening that penetrates the first organic layer.

In some embodiment of the present disclosure, the first insulating layer is a planarization layer, and the first organic layer is a pixel defining layer.

In some embodiment of the present disclosure, an orthographic projection of the conductive connection layer on the base substrate does not overlap an orthographic projection of the wire inlet portion on the base substrate.

In some embodiment of the present disclosure, an orthographic projection of the wire inlet portion included in the power supply voltage line on the base substrate overlaps an orthographic projection of the barrier wall on the base substrate.

In some embodiment of the present disclosure, the barrier wall comprises a first barrier wall and a second barrier wall; the first barrier wall includes a first barrier wall portion and a second barrier wall portion that are stacked, and the first barrier wall portion and the first organic layer are arranged at the same layer; the second barrier wall includes a third barrier wall portion, a fourth barrier wall portion, and a fifth barrier wall portion that are stacked; the third barrier wall portion is arranged at the same layer as the first insulating layer, the fourth barrier wall portion is arranged at the same layer as the first organic layer, and the fifth barrier wall portion is arranged at the same layer as the second barrier wall portion.

In some embodiment of the present disclosure, the common electrode layer is a cathode layer, and a cathode voltage line is the power supply voltage line.

In a second aspect, a display substrate includes a base substrate, and a source-drain metal layer and a common electrode layer sequentially arranged on the base substrate, wherein a pattern of the source-drain metal layer includes a power supply voltage line; the power supply voltage line includes a wire inlet portion; the display substrate includes an effective display area and a binding area; the display substrate further includes a barrier wall arranged on the base substrate and surrounding the effective display area; there is a gap between an orthographic projection of the barrier wall on the base substrate and an orthographic projection of the effective display area on the base substrate; the wire inlet portion includes a first part and a second part; an orthographic projection of the first part on the base substrate and an orthographic projection of the gap on the base substrate at least partially overlap; the second part is located at a side of the barrier wall away from the effective display area and located between the barrier wall and the binding area, and the second part is used for receiving power supply voltage signal; the display substrate further includes a conductive connection layer and a first organic layer; the conductive connection layer includes a first side surface and a second side surface; the first side surface is covered by the first organic layer, and the second side surface is at least partially covered by the first organic layer; the barrier wall includes a straight side portion and a corner portion, and a minimum distance between the second side surface and the corner portion is smaller than a minimum distance between the corner portion and the second part.

In some embodiment of the present disclosure, the second side surface comprises a portion not covered by the first organic layer.

In some embodiment of the present disclosure, the second side surface is completely covered by the first organic layer.

In some embodiment of the present disclosure, the power supply voltage line further comprises a main body, and the main body and the common electrode layer are of lap joint through the conductive connection layer.

In some embodiment of the present disclosure, the display substrate further includes a first insulating layer disposed between the power supply voltage line and the conductive connection layer; the common electrode layer and the first part are of direct lap-joint across a first opening that penetrates the first insulating layer and a second opening that penetrates the first organic layer.

In some embodiment of the present disclosure, the first insulating layer is a planarization layer, and the first organic layer is a pixel defining layer.

In some embodiment of the present disclosure, an orthographic projection of the conductive connection layer on the base substrate does not overlap with an orthographic projection of the wire inlet portion on the base substrate.

In some embodiment of the present disclosure, an orthographic projection of the wire inlet portion included in the power supply voltage line on the base substrate overlaps an orthographic projection of the barrier wall on the base substrate.

In some embodiment of the present disclosure, the barrier wall comprises a first barrier wall and a second barrier wall; the first barrier wall includes a first barrier wall portion and a second barrier wall portion that are stacked, and the first barrier wall portion and the first organic layer are arranged at the same layer; the second barrier wall includes a third barrier wall portion, a fourth barrier wall portion, and a fifth barrier wall portion that are stacked; the third barrier wall portion is arranged at the same layer as the first insulating layer, the fourth barrier wall portion is arranged at the same layer as the first organic layer, and the fifth barrier wall portion is arranged at the same layer as the second barrier wall portion.

In a third aspect, a display panel includes the above display substrate.

In a fourth aspect, a display device includes the above display panel.

In the display substrate, display panel and display device of at least one embodiment of the present disclosure, the common electrode layer is in direct contact with the power supply voltage line instead of lap-joint with the power supply voltage line through a conductive connection layer by the overlapping area between the common electrode layer and the power supply voltage line, thereby preventing water and oxygen from corroding the effective display area through a side surface of the conductive connection layer.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a portion of, rather than all of, the embodiments of the present disclosure, and based on these embodiments, a person skilled in the art may, without any creative effort, obtain the other embodiments, which also fall within the scope of the present disclosure.

The display substrate according to at least one embodiment of the present disclosure includes a base substrate, and a source-drain metal layer and a common electrode layer sequentially disposed on the base substrate; the pattern of the source-drain metal layer includes a power supply voltage line; the power supply voltage line includes a wire inlet portion; the display substrate includes an effective display area and a binding area.

The display substrate further includes a barrier wall arranged on the base substrate and surrounding the effective display area. There is a gap between an orthographic projection of the barrier wall on the base substrate and an orthographic projection of the effective display area on the base substrate.

The wire inlet portion includes a first part and a second part; an orthographic projection of the first part on the base substrate and an orthographic projection of the gap on the base substrate at least partially overlap; the second part is located at a side of the barrier wall away from the effective display area and located between the barrier wall and the binding area, and the second part is used for receiving power supply voltage signal.

The common electrode layer is in direct contact with the power supply voltage line in the overlapping area between the first part and the common electrode layer.

In the display substrate according to at least one embodiment of the present disclosure, the common electrode layer is in direct contact with the power supply voltage line instead of lap joint with the power supply voltage line through a conductive connection layer by the overlapping area between the common electrode layer and the power supply voltage line, thereby preventing water and oxygen from corroding the effective display area through a side surface of the conductive connection layer.

In at least one embodiment of the present disclosure, the common electrode layer may be a cathode layer, and the power supply voltage line may be a cathode voltage line, but it is not limited thereto.

Figure 1:
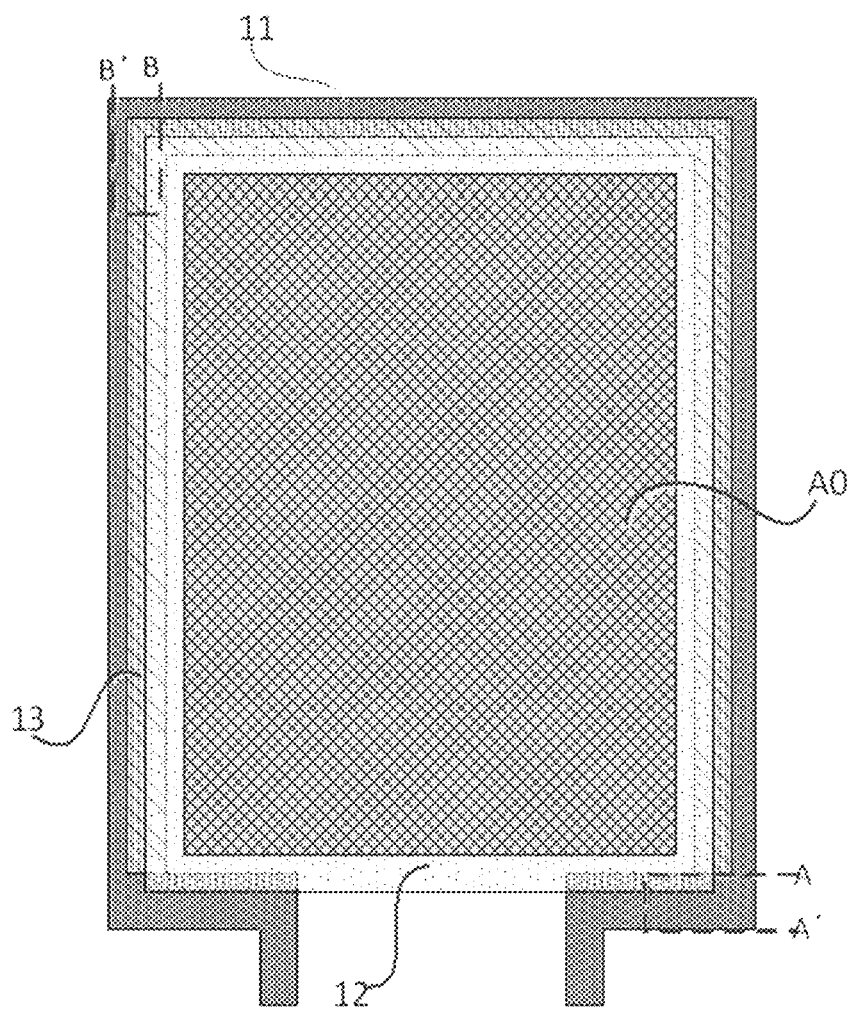
FIG. 1 is a top view of a display substrate according to at least one embodiment of the present disclosure.

As shown in FIG. 1, in the display substrate according to at least one embodiment of the present disclosure, the line labeled 11 is the power supply voltage line, the line labeled 12 is the common electrode layer, and the diagonal line labeled 13 is the anode layer, an area labeled A0 is the effective display area.

Figure 2:
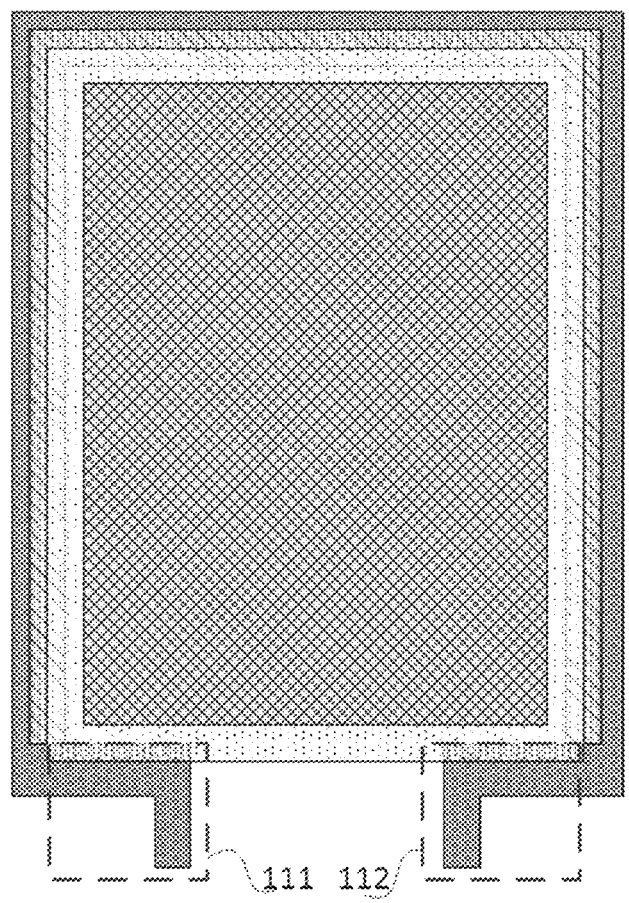
FIG. 2 is a schematic diagram showing a first wire inlet portion 111 and a second wire inlet portion 112 included in a power supply voltage line of the display substrate shown in FIG. 1 according to at least one embodiment of the present disclosure.

As shown in FIG. 2, in at least one embodiment of the display substrate shown in FIG. 1, the power supply voltage line includes a first wire inlet portion 111 and a second wire inlet portion 112.

Figure 3A:
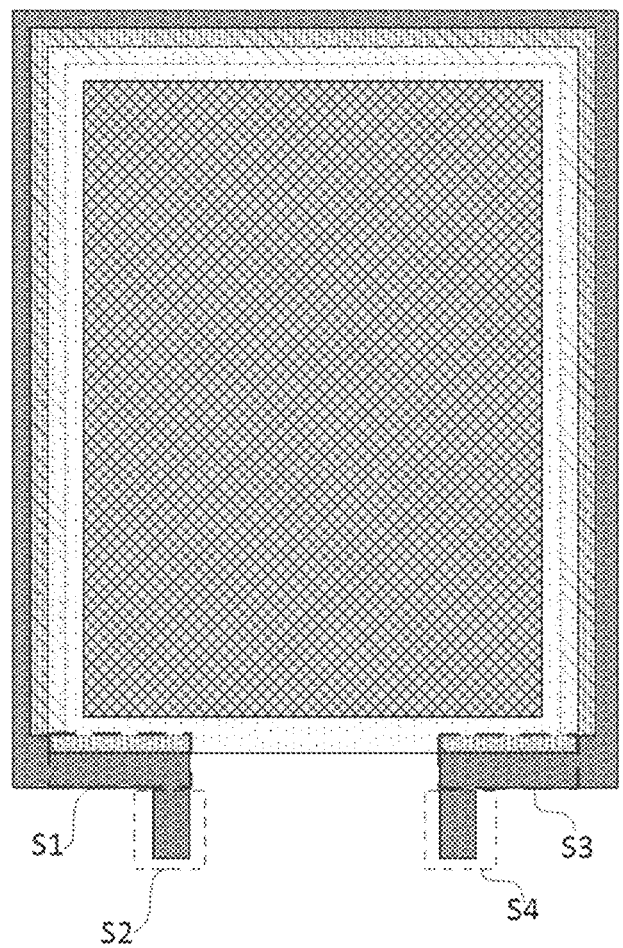
FIG. 3A is a schematic diagram showing a first part S1 included in the first wire inlet portion, a second part S2 included in the first wire inlet portion, and a first part S3 included in the second wire inlet portion and a second part S4 included in the second wire inlet portion according to at least one embodiment of the present disclosure.

As shown in FIG. 3A, in at least one embodiment of the display substrate, the first part included in the first wire inlet is labeled S1, and the second part included in the first wire inlet is labeled S2. The first part included in the second wire inlet portion is labeled S3, and the second part included in the second wire inlet portion is labeled S4.

Figure 3B:
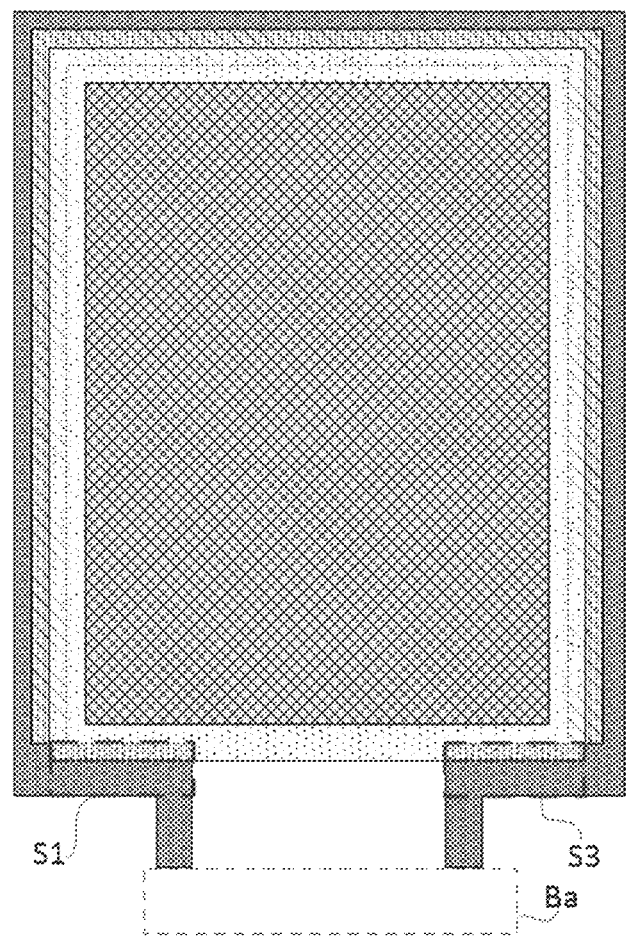
FIG. 3B is a schematic diagram of adding a binding area Ba in the display substrate shown in FIG. 3A according to at least one embodiment of the present disclosure.

In FIG. 3B, the area labeled Ba is the bonding area, and Chip On Flex (COF), Integrated Circuit (IC), etc. may be bonded in the bonding area.

Figure 4:
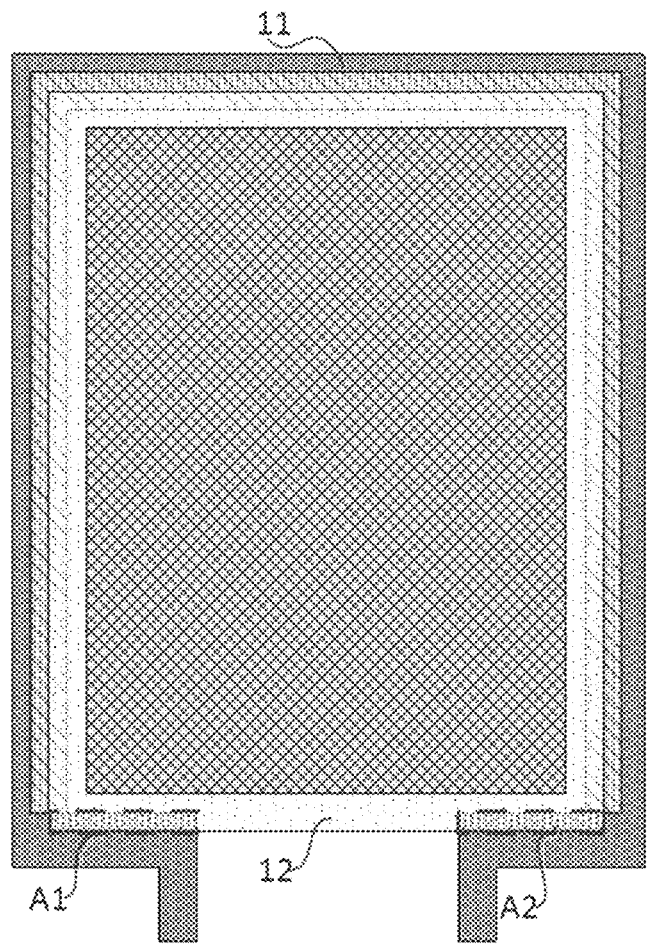
FIG. 4 is a schematic diagram showing an overlapping area A1 between the first part included in the first wire inlet portion and a common electrode layer 12 and an overlapping area A2 between the first part included in the second wire inlet portion and the common electrode layer 12 in the display substrate according to at least one embodiment of the present disclosure.

As shown in FIG. 4, in at least one embodiment of the display substrate, the common electrode layer 12 is in direct contact with the power supply voltage line 11 in the overlap area A1 between the first part included in the first wire inlet portion and the common electrode layer 12.

The common electrode layer 12 is in direct contact with the power supply voltage line 11 in the overlapping area A2 between the first part included in the second wire inlet portion and the common electrode layer 12.

In at least one embodiment of the present disclosure, the overlapping area between the first part and the common electrode layer refers to: in the overlapping area, the orthographic projection of the first part on the base substrate overlaps the orthographic projection of the common electrode layer on the base substrate to each other.

Figure 5:
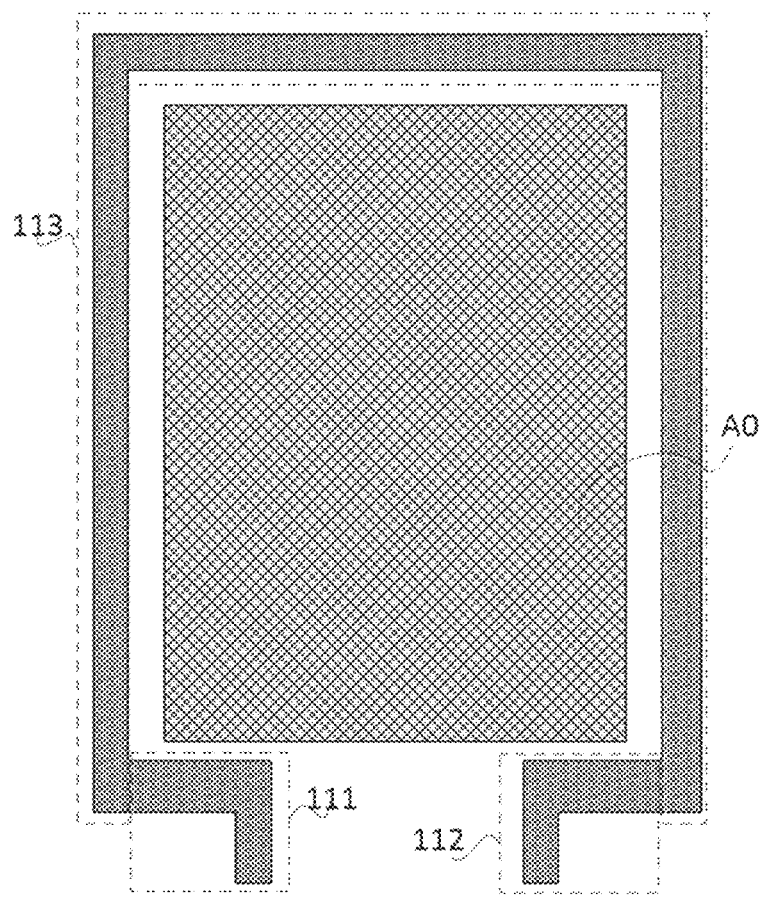
FIG. 5 is a schematic diagram showing a first wire inlet portion 111, a second wire inlet portion 112, and a main body 113 included in the power supply voltage line in the display substrate according to at least one embodiment of the present disclosure.

In FIG. 5, only the effective display area A0 and the power supply voltage line are shown, and the power supply voltage line includes a first wire inlet portion 111, a second wire inlet portion 112 and a main body 113.

Specifically, the display substrate according to at least one embodiment of the present disclosure further includes a first insulating layer disposed between the power voltage line and the conductive connection layer, and a first organic layer disposed between the conductive connection layer and the common electrode layer.

The common electrode layer and the first part are of lap-joint across a first opening that penetrates the first insulating layer and a second opening that penetrates the first organic layer.

Figure 6A:
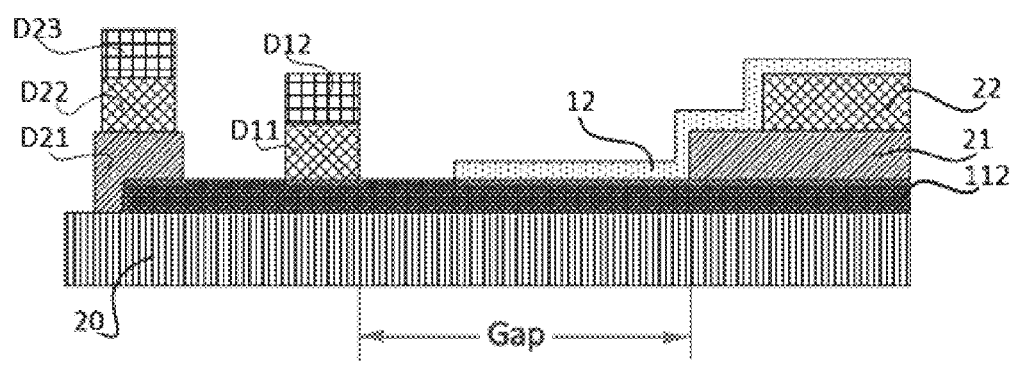
FIG. 6A is a cross-sectional view along A-A' in FIG. 1.

FIG. 6A is a cross-sectional view along A-A' in FIG. 1.

As shown in FIG. 6A, on the lower right side of the embodiment of the display substrate shown in FIG. 1 of the present disclosure, the display substrate includes a base substrate 20; the second wire inlet portion 112 included in the power supply voltage line provided on the base substrate 20; and the first insulating layer 21, the first organic layer 22, and the common electrode layer 12 sequentially arranged on the side of the second wire inlet portion 112 away from the base substrate 20.

As shown in FIG. 6A, on the lower right side of at least one embodiment of the display substrate, the common electrode layer 12 and the first part of the second wire inlet portion 112 included in the power supply voltage line are of lap-joint across the first opening that penetrates the first insulating layer 21 and the second opening 22 that penetrates the first organic layer.

And as shown in FIG. 6A, the display substrate further includes a first barrier wall and a second barrier wall.

The first barrier wall includes a first barrier wall portion D11 and a second barrier wall portion D12 that are stacked, and the first barrier wall portion D11 and the first organic layer 22 are arranged at the same layer.

The second barrier wall includes a third barrier wall portion D21, a fourth barrier wall portion D22, and a fifth barrier wall portion D23 that are stacked.

The third barrier wall portion D21 is arranged at the same layer as the first insulating layer 21, the fourth barrier wall portion D22 is arranged at the same layer as the first organic layer 22, and the fifth barrier wall portion D23 is arranged at the same layer as the second barrier wall D12.

The first barrier wall and the second barrier wall are arranged on a side of the power supply voltage line 11 away from the base substrate 20. In FIG. 6A, the first insulating layer 21 may be a flat layer, the first organic layer 22 may be a pixel defining layer, and the second barrier wall portion D12 and the fifth barrier wall portion D23 may be spacers, but not limited to this.

Specifically, the display substrate may further include a conductive connection layer disposed between the power supply voltage line and the common electrode layer.

The power supply voltage line further includes a main body, and the main body and the common electrode layer are of lap-joint through the conductive connection layer.

As shown in FIG. 1, the display substrate according to at least one embodiment of the present disclosure is not provided with an anode layer 13 in the lower left corner and the lower right corner, to prevent water and oxygen from corroding the effective display area A0 through the side surface of the conductive connecting layer. However, as shown in FIG. 2, in the left side, right side, and upper side of the display substrate are still provided with an anode layer 13, and the main body included in the power supply voltage line 11 and the common electrode layer 12 are of lap-joint through the anode layer 13.

In specific implementation, the conductive connection layer may be an anode layer, but is not limited to this.

Specifically, the display substrate according to at least one embodiment of the present disclosure may further include an anode disposed in the effective display area, the conductive connection layer and the anode are arranged at the same layer.

Figure 6B:
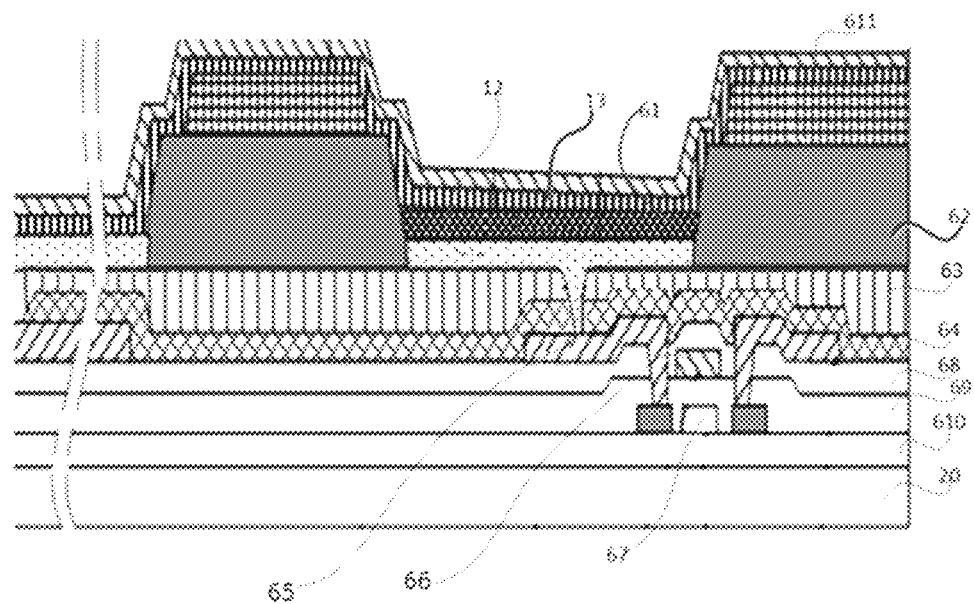
FIG. 6B is a cross-sectional view of the display substrate according to at least one embodiment of the present disclosure.

As shown in FIG. 6B, the display substrate according to at least one embodiment of the present disclosure may include a base substrate 20, a common electrode layer 12, an anode layer 13, an organic light emitting layer 61, a pixel defining layer 62, a planarization layer 63, an inorganic layer 64, a source-drain metal layer 65, a gate metal layer 66, an active layer 67, an interlayer dielectric layer 68, a gate insulating layer 69 and a buffer layer 610. In FIG. 6B, the package substrate is labeled 611.

As shown in FIG. 6B, in the display substrate according to at least one embodiment of the present disclosure, the source-drain metal layer 64 is directly connected to the anode layer 60 through a via hole. In at least one embodiment of the present disclosure, the conductive connection layer may be the anode layer 60, but it is not limited thereto.

In at least one embodiment of the display substrate shown in FIG. 6B, the pixel defining layer 62 can be arranged at the same layer and made of the same material as the first organic layer, and the source-drain electrode layer 65 can be arranged at the same layer and made of the same material as the power voltage line, the anode layer 13 can be arranged at the same layer and made of the same material as and the conductive connection layer, but it is not limited thereto.

Figure 7A:
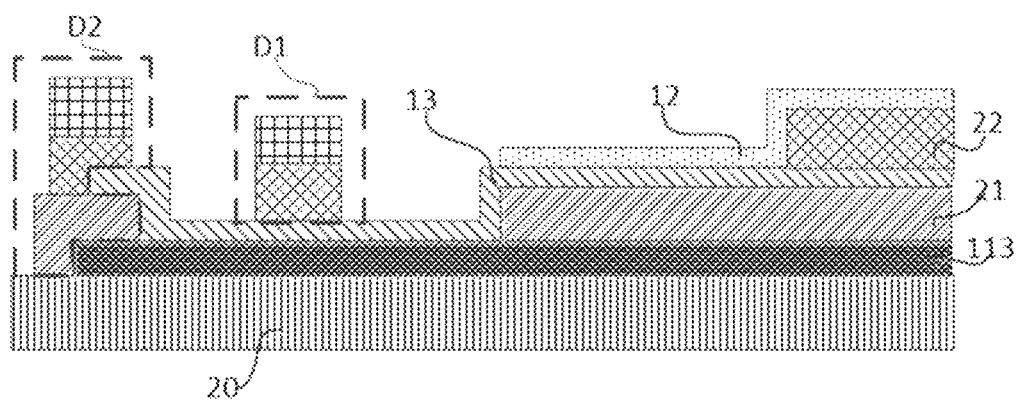
FIG. 7A is a cross-sectional view along B-B' in FIG. 1.

FIG. 7A is a cross-sectional view along B-B' in FIG. 1.

As shown in FIG. 7A, on the left side of at least one embodiment of the display substrate shown in FIG. 1 of the present disclosure, the display substrate includes a base substrate 20, and a main body 113 included in the power supply voltage line provided on the base substrate 20, and a first insulating layer 21, an anode layer 13, a first organic layer 22, and a common electrode layer 12 that are sequentially disposed on a side of the main body 113 away from the base substrate 20.

On the left side of at least one embodiment of the display substrate, the common electrode layer 12 and the main body 113 included in the power supply voltage line are of lap joint through the anode layer 13.

Figure 7B:
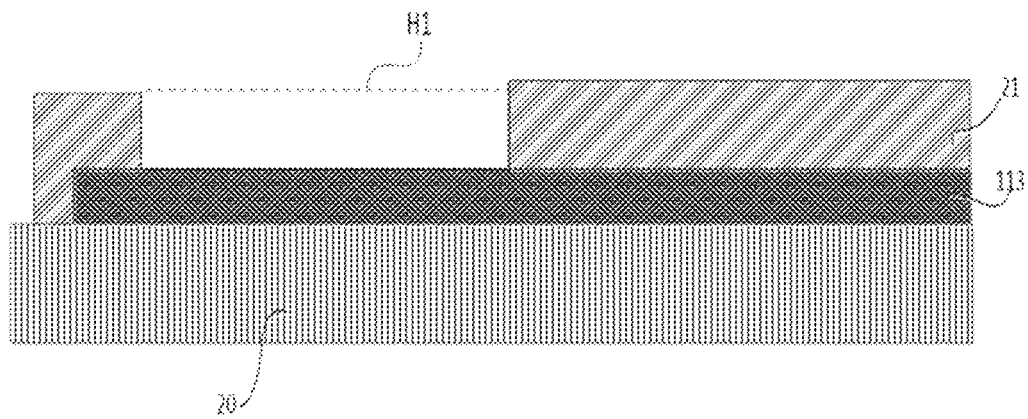
FIG. 7B is a schematic diagram showing a first opening H1 in FIG. 7A.

In FIG. 7A, the first barrier wall is labeled D1, and the second barrier wall is labeled D2. In FIG. 7B, the first opening is labeled H1, and in FIG. 7C, the second opening is labeled H2. In FIG. 7B, only the base substrate 20, the main body 113, and the first insulating layer 21 are shown.

Figure 7C:
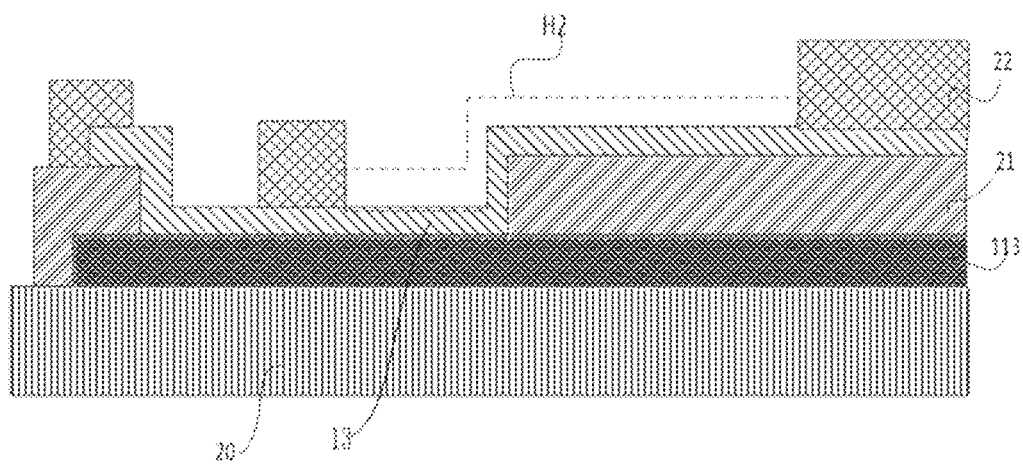
FIG. 7C is a schematic diagram showing a second opening H2 in FIG. 7A.

In FIG. 7C, only the base substrate 20, the main body 113, the anode layer 13, the first insulating layer 21, and the first organic layer 22 are shown.

In at least one embodiment of the present disclosure, the first insulating layer may be a planarization layer, and the first organic layer may be a pixel defining layer.

Optionally, the orthographic projection of the conductive connection layer on the base substrate and the orthographic projection of the wire inlet portion on the base substrate do not overlap.

In an embodiment of the present disclosure, the orthographic projection of the conductive connection layer on the base substrate and the orthographic projection of the wire inlet portion on the base substrate do not overlap, so that the side surface of the conductive connection layer is far away from the second part included in the wire inlet portion, so as to prevent water and oxygen from corroding the effective display area through the side surface of the conductive connection layer.

Specifically, the orthographic projection of the wire inlet portion included in the power supply voltage line on the base substrate overlaps the orthographic projection of the barrier wall on the base substrate.

Specifically, the barrier wall may include a first barrier wall and a second barrier wall.

The first barrier wall includes a first barrier wall portion and a second barrier wall portion that are stacked, and the first barrier wall portion and the first organic layer are arranged at the same layer.

The second barrier wall includes a third barrier wall portion, a fourth barrier wall portion, and a fifth barrier wall portion that are stacked. The third barrier wall portion is arranged at the same layer as the first insulating layer, the fourth barrier wall portion is arranged at the same layer as the first organic layer, and the fifth barrier wall portion is arranged at the second barrier wall.

In a specific implementation, the barrier wall may include a first barrier wall and a second barrier wall, the first barrier wall and the second barrier wall each may be a multilayer laminated structure, and the first barrier wall portion included in the first barrier wall is arranged at the same layer as the first organic layer, and the fourth barrier wall portion included in the second barrier wall is arranged at the same layer as the first organic layer.

Figure 8A:
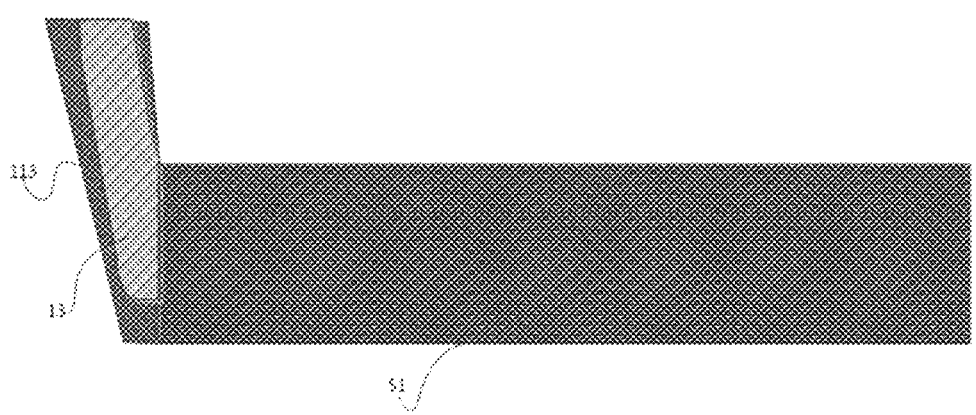
FIG. 8A is a schematic diagram showing the positional relationship between an anode layer 13 and the first part S1 of the first wire inlet portion included in the power supply voltage line on a lower side of the display substrate according to at least one embodiment of the present disclosure.

As shown in FIG. 8A, the first part of the first wire inlet portion included in the power supply voltage line is labeled S1, and the anode layer is labeled 13. In FIG. 8A, the portion covered by the anode layer 13 may be the main body 113 included in the power supply voltage line.

Figure 8B:
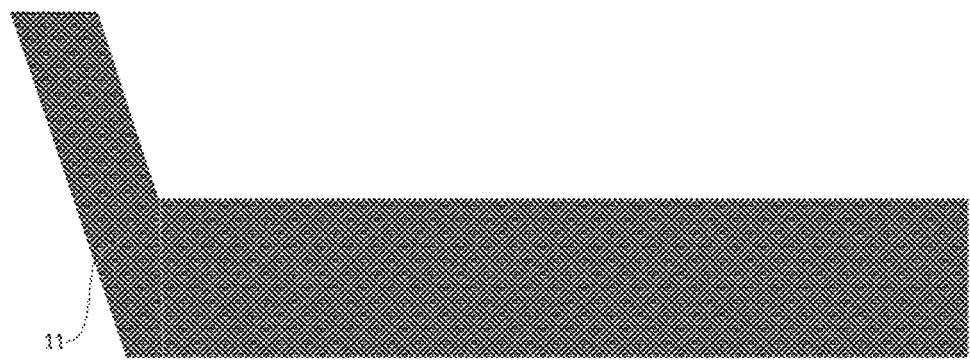
FIG. 8B is a top view of the power supply voltage line 11 on the lower side of the display substrate according to at least one embodiment of the present disclosure.
Figure 8C:
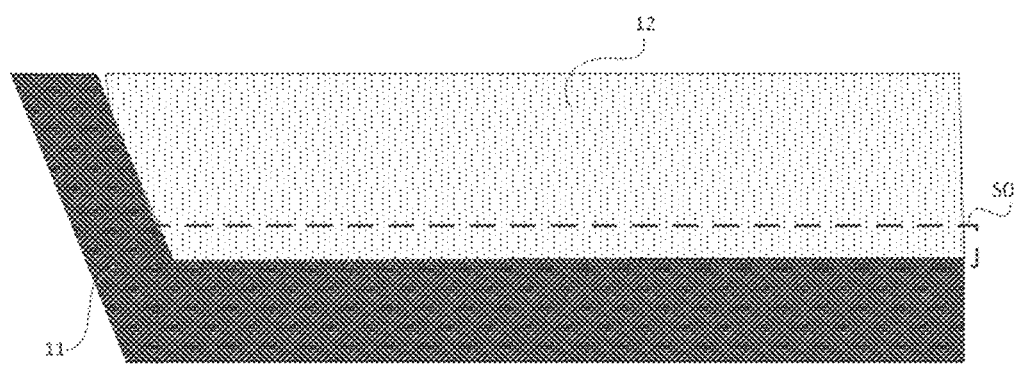
FIG. 8C is a schematic diagram showing the positional relationship among a direct contact area S0, the power supply voltage line 11 and the common electrode layer 12 on the lower side of the display substrate according to at least one embodiment of the present disclosure.

In FIG. 8B, the power supply voltage line is labeled 11. In FIG. 8C, the common electrode layer is labeled 12. In the direct contact area S0, the common electrode layer 12 is in direct contact with the power supply voltage line 11.

Figure 8D:
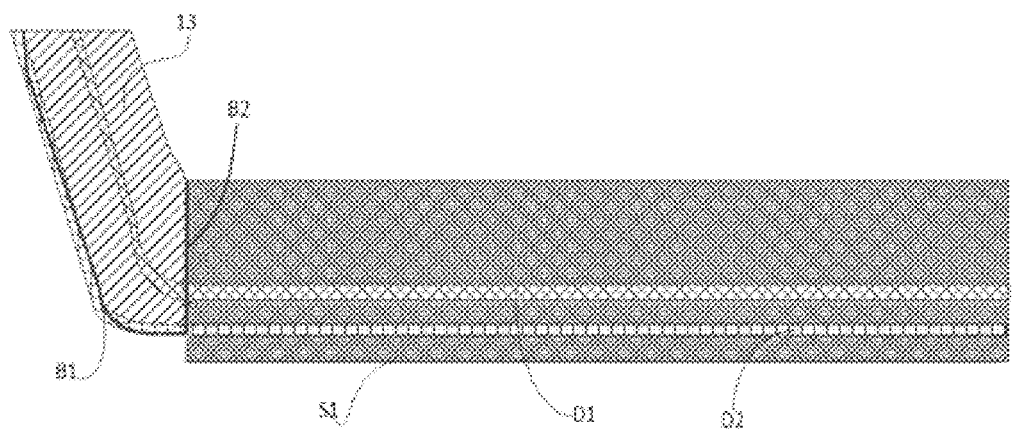
FIG. 8D is a schematic diagram showing the positional relationship among a first barrier wall D1, a second barrier wall D2, the anode layer 13, and the first part S1 of the first wire inlet portion included in the power supply voltage line on the lower side of the display substrate according to at least one embodiment of the present disclosure.

In FIG. 8D, the first barrier wall is labeled D1, the second barrier wall is labeled D2, the first part of the first wire inlet portion included in the power supply voltage line is labeled S1, and the anode layer is labeled 13.

In FIG. 8D, the anode layer 13 includes a first side surface B1 and a second side surface B2.

The first side surface B1 is an outer boundary surface of the anode layer 13, and the first side surface B1 is shown by a thicker line in FIG. 8D.

The first side surface B1 may be covered by the organic layer, and the second side surface B2 may be partially covered by the organic layer.

In at least one embodiment shown in FIG. 8D, the first side surface B1 is covered by the second barrier wall D2, but it is not limited to this. In specific implementation, the first side surface B1 may also be covered by the first barrier wall D1.

In at least one embodiment of the present disclosure, the first barrier wall D1 and the second barrier wall D2 may be made of an organic material.

Figure 8E:
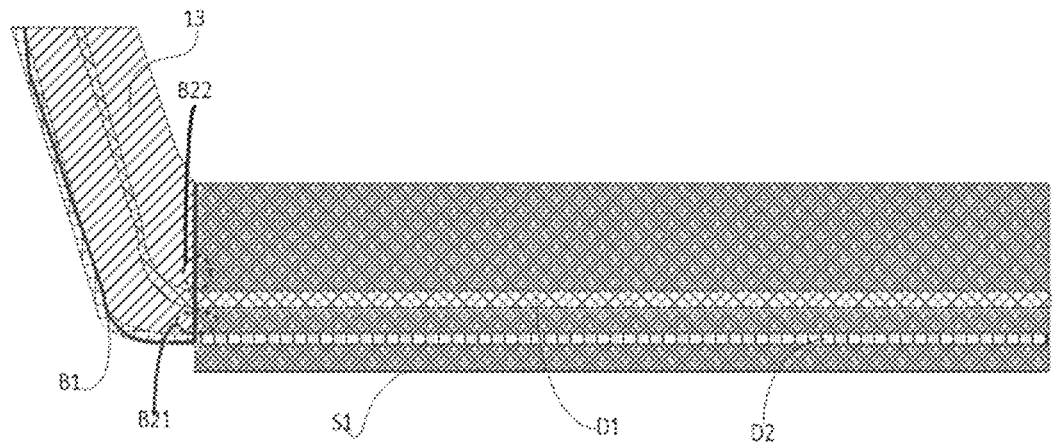
FIG. 8E is a schematic diagram showing a first side surface portion B21 and a second side surface portion B22 on the basis of FIG. 8D.

As shown in FIG. 8E, the second side surface B2 may include a first side surface portion B21 and a second side surface portion B22.

B21 is arranged between D1 and D2, B21 is not covered by an organic layer; B22 is arranged above D1, and B22 is also not covered by an organic layer; a part of the second side surface B2 other than B21 and B22 can be covered by an organic layer. At this time, B21 and B22 are used to isolate water vapor.

However, in actual operation, B21 and/or B22 can also be covered by an organic layer to protect the boundary of the anode layer.

In at least one embodiment of the present disclosure, the organic layer may be a first organic layer or a barrier wall, but it is not limited thereto.

In at least one embodiment of the present disclosure, the portion of the second side surface that is not covered by the organic layer is in the corner area of the second barrier wall (that is, closer to the corner of the second barrier wall D2), and is far away from the effective display area, and far away from the second part of the wire inlet portion of the power supply voltage line to avoid forming water and oxygen intrusion channels close to the effective display area.

Moreover, regardless of whether the second side surface is covered by the organic layer, the second side surface may also be located in the corner area of the second barrier wall.

In FIG. 8A, FIG. 8D and FIG. 8E, the main body is labeled 113.

Figure 8F:
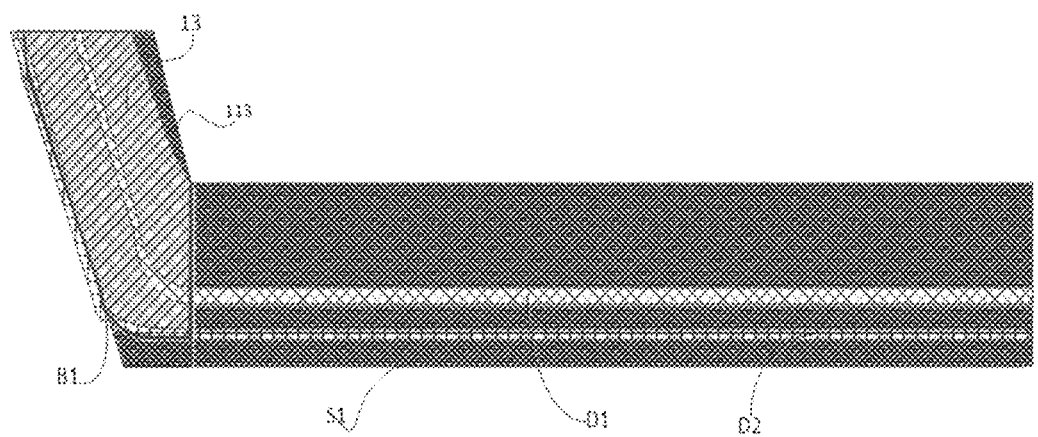
FIG. 8F is a schematic diagram of adding the main body 113 on the basis of FIG. 8D.

As shown in FIG. 8F, a main body 113 is added in FIG. 8D, and the outer boundary surface of the main body 113 may be under the second barrier wall D2, but is not limited to this. In actual operation, the outer boundary surface on the left side of the main body 113 can also be on the left side of the second barrier wall D2, that is, it can slightly exceed the second barrier wall D2 to reduce electrical resistance.

Figure 8G:
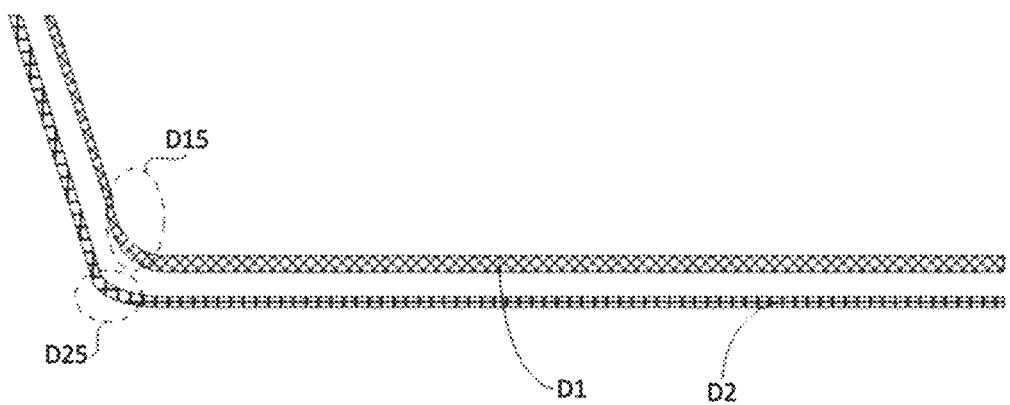
FIG. 8G is a top view of the first barrier wall D1 and the second barrier wall D2 in FIG. 8D.

In FIG. 8G, only the first barrier wall D1 and the second barrier wall D2 in FIG. 8D are shown. D1 includes a first corner portion D11 and a first straight side portion (the first straight side portion may be a portion included in D1 other than the corner portion), D2 includes a second corner portion D21 and a second straight side portion (the second straight side portion may be a portion included in D2 other than the corner portion).

The minimum distance between the second side surface B2 and the second corner portion D21 is smaller than the minimum distance between the second corner portion D21 and the second part, so that the second side surface B2 is far away from the effective display area and the second part.

FIGS. 8A to 9B are top views.

Figure 9A:
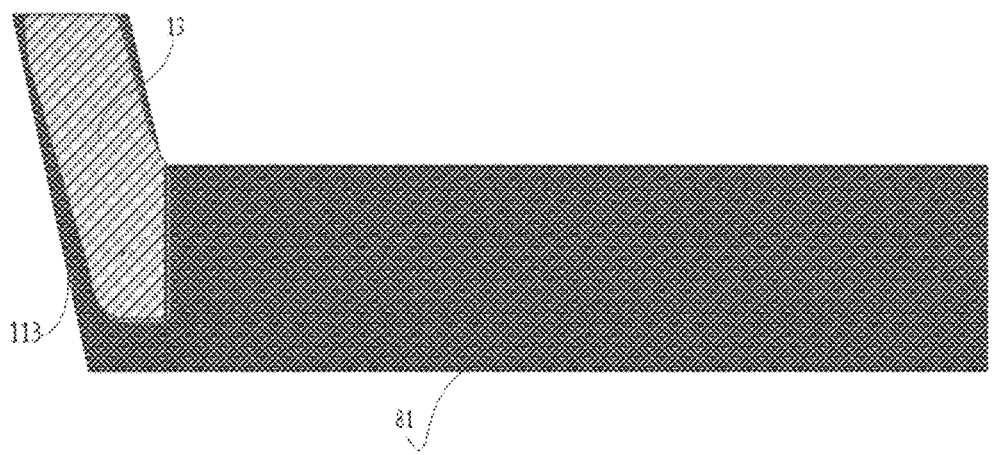
FIG. 9A is a top view of a part of the anode layer 13 and the first part 81 in the display substrate according to at least one embodiment of the present disclosure.

As shown in FIG. 9A, the anode layer is labeled 13, and the first part is labeled 81; in the embodiment of FIG. 9A, the orthographic projection of the anode layer 13 on the base substrate is within the orthographic projection of the main body 113 of the power supply voltage line on the base substrate.

In FIG. 9A, the portion covered by the anode layer 13 may be the main body 113 of the power supply voltage line.

Figure 9B:
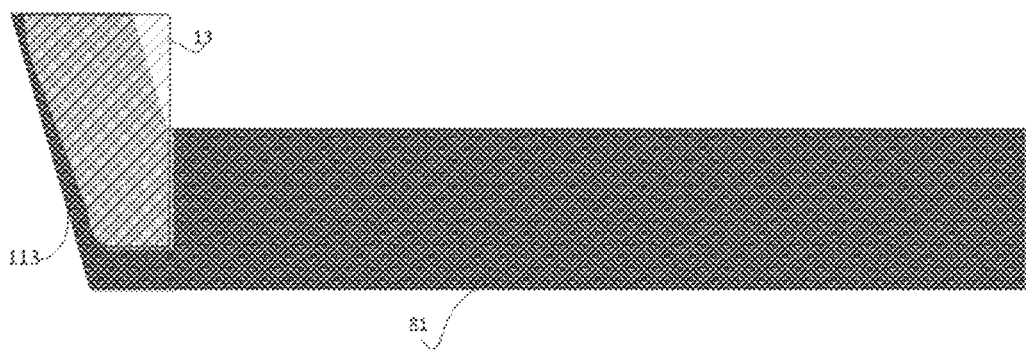
FIG. 9B is a top view of a part of the anode layer 13 and the first part 81 in the display substrate according to at least one embodiment of the present disclosure.

Optionally, as shown in FIG. 9B, the orthographic projection of the anode layer 13 on the base substrate may not be completely within the orthographic projection of the main body 113 on the base substrate. At this time, the area of anode layer 13 is increased to reduce resistance.

Figure 10:
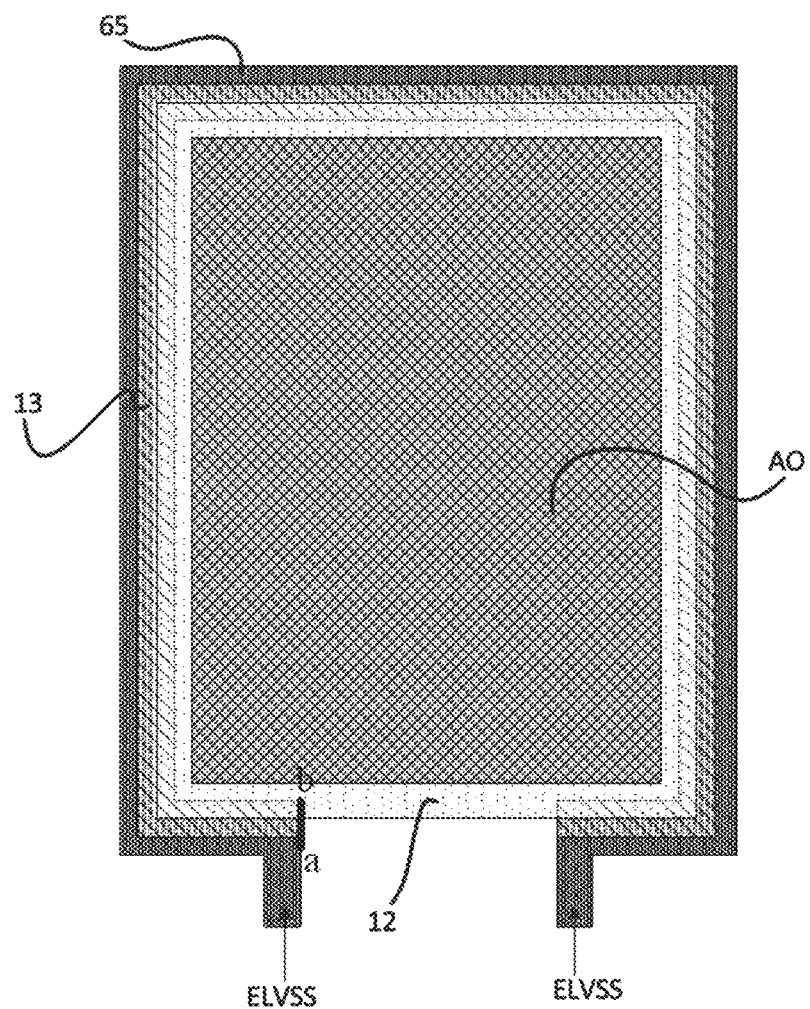
FIG. 10 is a top view of a related display substrate.

As shown in FIG. 10, in the related display substrate, the source-drain metal layer is labeled 60, the common electrode layer is labeled 12, the anode layer is labeled 13, and the effective display area is labeled A0.

In the related display substrate shown in FIG. 10, the smallest area in the middle is the effective display area A0, the common electrode layer 12 covering the entire effective display area A0 is a layer of semi-transparent metal conductive film layer, usually the area of the common electrode layer 12 is larger than the area of the effective display area A0, the portion of the common electrode layer 12 that is beyond the effective display area A0 is in contact with the anode layer 13, and the anode layer 13 is an opaque conductive layer, the anode layer 13 is generally in full contact with the common electrode layer 12 on the left, right and upper sides of the display substrate; and on the lower left corner and the lower right corner of the display substrate, the anode layer 13 is in partial contact with the common electrode layer 12; a signal is not directly applied to the anode layer 13, and the signal is applied to the anode layer 13 through the source-drain metal layer located under the anode layer 13 and connected to the anode layer. The source-drain metal layer 60 is a conductive metal layer, and the source-drain metal layer 60 includes a power supply voltage line to receive the cathode voltage ELVSS.

Figure 11:
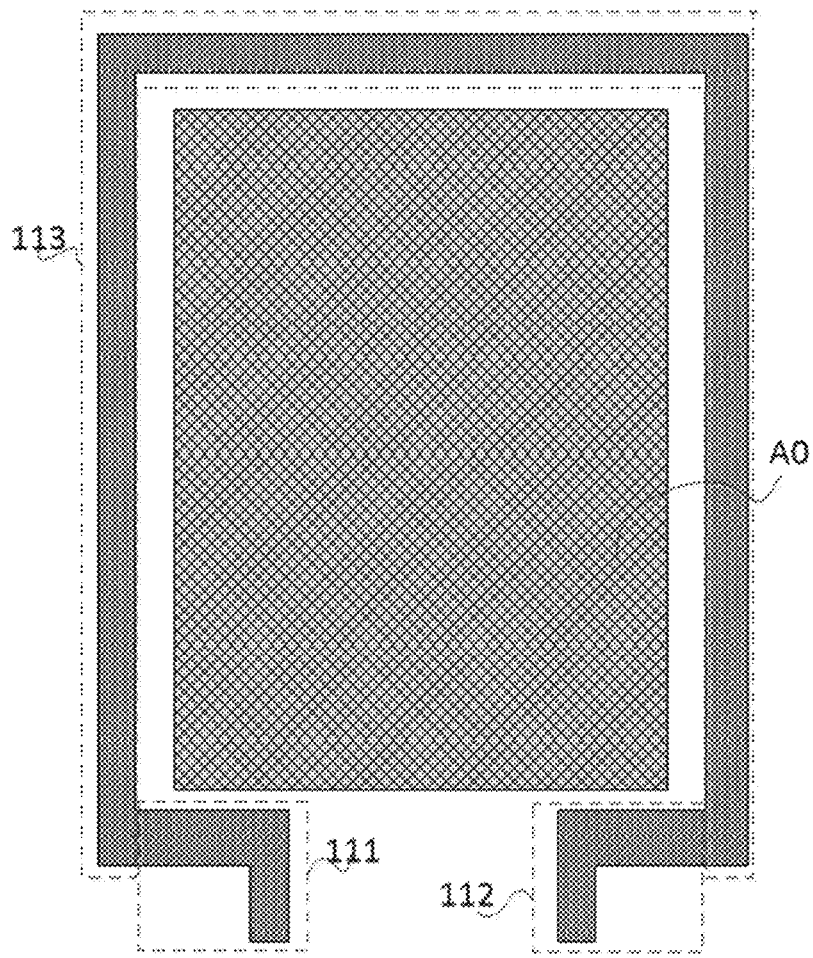
FIG. 11 is a schematic diagram showing the first wire inlet portion 111, the second wire inlet portion 112 and the main body 113 included in the power supply voltage line in the related display substrate.

In the related art, as shown in FIG. 11, the source-drain metal layer includes the power supply voltage line, and the power supply voltage line may include a first wire inlet portion 111, a second wire inlet portion 112, and a main body 113.

The main body 113 is arranged around the effective display area A0, and the main body 113 is arranged on the left side, right side and upper side of the effective display area A0; the first wire inlet portion 111 is located at the lower left corner of the effective display area A0, the second wire inlet portion 112 is located at the lower right corner of the effective display area A0.

In FIG. 11, only the effective display area A0 and the power supply voltage line are shown.

In the related art and at least one embodiment of the present disclosure, a driving integrated circuit may be provided on the lower side of the effective display area A0, and the driving integrated circuit is used to provide a cathode voltage ELVSS for the power supply voltage line.

As shown in FIG. 10, in the related display substrate, water and oxygen easily invade into the effective display area A0 from a position a-b in FIG. 10 along the boundary of the anode layer 13, and the position is very close to the effective display area AA0. A channel for water and oxygen intrusion is easily formed in the boundary of the anode layer 13, the channel is very close to the effective area A0. Once the water and oxygen invade, the luminescent material close to the channel is easily oxidized, which will eventually result in the denaturation and failure of the luminescent material and light emitting pixels nearby, thereby forming dark spots.

Based on this, in at least one embodiment of the present disclosure, the anode layer at the left and right lower corners of the display substrate is removed, so that the edge of the anode layer is away from the position a-b in FIG. 10 to prevent water and oxygen from invading the effective display area.

The display substrate according to at least one embodiment of the present disclosure includes a base substrate, and a source-drain metal layer and a common electrode layer sequentially arranged on the base substrate.

A pattern of the source-drain metal layer includes a power supply voltage line; the power supply voltage line includes a wire inlet portion; the display substrate includes an effective display area and a binding area.

The display substrate further includes a barrier wall arranged on the base substrate and surrounding the effective display area; there is a gap between an orthographic projection of the barrier wall on the base substrate and an orthographic projection of the effective display area on the base substrate.

The wire inlet portion includes a first part and a second part; an orthographic projection of the first part on the base substrate and an orthographic projection of the gap on the base substrate at least partially overlap; the second part is located at a side of the barrier wall away from the effective display area and located between the barrier wall and the binding area, and the second part is used for receiving power supply voltage signal.

The display substrate further includes a conductive connection layer and a first organic layer.

The conductive connection layer includes a first side surface and a second side surface; the first side surface is covered by the first organic layer, and the second side surface is at least partially covered by the first organic layer.

The barrier wall includes a straight side portion and a corner portion, and the minimum distance between the second side surface and the corner portion is smaller than the minimum distance between the corner portion and the second part.

In the display substrate of at least one embodiment of the present disclosure, the first side surface of the conductive layer is set to be covered by the first organic layer, which can prevent water and oxygen from entering the effective display area through the side surface of the conductive connection layer. In the display substrate of the embodiment, the second side surface included in the conductive connection layer is arranged far away from the second part, so as to avoid the formation of a water and oxygen intrusion channel close to the effective display area.

Optionally, the second side surface may include a portion not covered by the first organic layer.

Optionally, the second side surface may also be completely covered by the first organic layer. At this time, the first organic layer and the barrier wall adjoin, that is, the portion of the first organic layer covering the second side surface and the barrier wall are an integral structure.

Specifically, the power supply voltage line further includes a main body, and the main body and the common electrode layer are of lap-joint through the conductive connection layer.

Specifically, the display substrate of the present disclosure may further include a first insulating layer disposed between the power supply voltage line and the conductive connection layer.

The common electrode layer and the main body are of lap-joint across a first opening penetrating the first insulating layer and a second opening penetrating the first organic layer.

In at least one embodiment of the present disclosure, the first insulating layer may be a planarization layer, and the first organic layer may be a pixel defining layer.

Optionally, the orthographic projection of the conductive connection layer on the base substrate and the orthographic projection of the wire inlet portion on the base substrate do not overlap.

Optionally, the orthographic projection of the conductive connection layer on the base substrate and the orthographic projection of the wire inlet portion on the base substrate do not overlap, so that the side surface of the conductive connection layer is far away from the second part included in the wire inlet portion, so as to prevent water and oxygen from entering the effective display area through the side surface of the conductive connection layer.

Specifically, the orthographic projection of the wire inlet portion included in the power supply voltage line on the base substrate overlaps the orthographic projection of the barrier wall on the base substrate.

In specific implementation, the barrier wall may include a first barrier wall and a second barrier wall.

The first barrier wall includes a first barrier wall portion and a second barrier wall portion that are stacked, and the first barrier wall portion and the first organic layer are arranged at the same layer.

The second barrier wall includes a third barrier wall portion, a fourth barrier wall portion, and a fifth barrier wall portion that are stacked.

The third barrier wall portion is arranged at the same layer as the first insulating layer, the fourth barrier wall portion is arranged at the same layer as the first organic layer, and the fifth barrier wall portion is arranged at the same layer as the second barrier wall portion.

The display panel according to at least one embodiment of the present disclosure may include the above-mentioned display substrate.

The display device described in at least one embodiment of the present disclosure may include the above-mentioned display panel.

In the embodiments of the present disclosure, the display device may be any product or member having a display function, e.g., mobile phone, tablet personal computer, television, display, laptop computer, digital phot frame or navigator.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate comprising a base substrate, and a source-drain metal layer and a common electrode layer sequentially disposed on the base substrate, wherein
    a pattern of the source-drain metal layer comprises a power supply voltage line; the power supply voltage line comprises a wire inlet portion and a main body; the display substrate comprises an effective display area and a binding area;
    the display substrate further comprises a barrier wall arranged on the base substrate and surrounding the effective display area, there is a gap between an orthographic projection of the barrier wall on the base substrate and an orthographic projection of the effective display area on the base substrate;
    the main body is arranged around at least part of the effective display area, an orthographic projection of the wire inlet portion on the base substrate is located between an orthographic projection of the effective display area on the base substrate and an orthographic projection of the binding area on the base substrate; the wire inlet portion comprises a first part and a second part;
    an orthographic projection of the first part on the base substrate and an orthographic projection of the main body on the base substrate at least partially overlap the orthographic projection of the barrier wall on the base substrate; the second part is located at a side of the barrier wall away from the effective display area and located between the barrier wall and the binding area, and the second part is used for receiving power supply voltage signal; at least part of the first part extends along a first direction, at least part of the second part extends along a second direction, and the first direction intersects the second direction;

the display substrate further comprises a conductive connection layer and an organic light emitting layer arranged at a side of the source-drain metal layer away from the base substrate; the common electrode layer is arranged at a side of the organic light emitting layer away from the base substrate;

the first part is in direct contact with the common electrode layer for electrical connection; and the main body is electrically connected with the common electrode layer through the conductive connection layer; and an orthographic projection of the conductive connection layer on the base substrate does not overlap the orthographic projection of the first part on the base substrate; and in the plane parallel to the base substrate, the first part is in direct contact with the common electrode layer.

2. The display substrate according to claim 1, further comprising an anode provided in the effective display area; the conductive connection layer and the anode are arranged at the same layer.

3. The display substrate according to claim 1, further comprising a first insulating layer disposed between the power supply voltage line and the conductive connection layer, and a first organic layer disposed between the conductive connection layer and the common electrode layer, wherein the common electrode layer and the first part are connected across a first opening that penetrates the first insulating layer and a second opening that penetrates the first organic layer.

4. The display substrate according to claim 3, wherein the first insulating layer is a planarization layer, and the first organic layer is a pixel defining layer.

5. The display substrate according to claim 3, wherein an orthographic projection of the conductive connection layer on the base substrate does not overlap an orthographic projection of the wire inlet portion on the base substrate.

6. The display substrate according to claim 1, wherein an orthographic projection of the wire inlet portion comprised in the power supply voltage line on the base substrate overlaps an orthographic projection of the barrier wall on the base substrate.

7. The display substrate according to claim 3, wherein the barrier wall comprises a first barrier wall and a second barrier wall;

the first barrier wall comprises a first barrier wall portion and a second barrier wall portion that are stacked, and the first barrier wall portion and the first organic layer are arranged at the same layer;

the second barrier wall comprises a third barrier wall portion, a fourth barrier wall portion, and a fifth barrier wall portion that are stacked;

the third barrier wall portion is arranged at the same layer as the first insulating layer, the fourth barrier wall portion is arranged at the same layer as the first organic layer, and the fifth barrier wall portion is arranged at the same layer as the second barrier wall portion.

8. The display substrate according claim 1, wherein the common electrode layer is a cathode layer, and a cathode voltage line is the power supply voltage line.

9. The display substrate according to claim 1, further comprising a first organic layer; wherein the conductive connection layer comprises a first side surface and a second side surface; the first side surface is covered by the first organic layer, and the second side surface is at least partially covered by the first organic layer;

the barrier wall comprises a straight side portion and a corner portion, and a minimum distance between the second side surface and the corner portion is smaller than a minimum distance between the corner portion and the second part.

10. The display substrate according to claim 9, wherein the second side surface comprises a portion not covered by the first organic layer.

11. The display substrate according to claim 9, wherein the second side surface is completely covered by the first organic layer.

12. A display panel comprising the display substrate according to claim 1.

13. A display device comprising the display panel according to claim 12.

* * * * *